United States Patent
Partow et al.

(10) Patent No.: US 9,294,063 B1
(45) Date of Patent: Mar. 22, 2016

(54) DIGITAL INPUT CIRCUIT AND METHOD FOR HIGH VOLTAGE SENSORS

(75) Inventors: Anthony S. Partow, Dallas, TX (US); Pirooz Parvarandeh, Los Altos Hills, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 931 days.

(21) Appl. No.: 13/472,360

(22) Filed: May 15, 2012

(51) Int. Cl.
*H03G 11/00* (2006.01)

(52) U.S. Cl.
CPC .................................. *H03G 11/004* (2013.01)

(58) Field of Classification Search
CPC ... H03G 11/00; H03G 11/004; H03G 11/008; H03G 11/002
See application file for complete search history.

(56) References Cited

U.S. PATENT DOCUMENTS

| | | | | |
|---|---|---|---|---|
| 4,263,565 A | * | 4/1981 | Astle | 331/15 |
| 4,368,434 A | * | 1/1983 | Miller et al. | 329/336 |
| 4,485,347 A | * | 11/1984 | Hirasawa et al. | 329/303 |
| 4,775,808 A | * | 10/1988 | Trumpp | 326/34 |
| 5,028,887 A | * | 7/1991 | Gilmore | 331/18 |
| 5,815,213 A | * | 9/1998 | Meunier | 348/533 |
| 6,163,199 A | * | 12/2000 | Miske et al. | 327/434 |
| 6,208,195 B1 | * | 3/2001 | Wyland | 327/434 |
| 7,414,557 B2 | * | 8/2008 | Andersson et al. | 341/143 |
| 8,525,713 B2 | * | 9/2013 | Wang | 341/118 |
| 8,610,443 B1 | * | 12/2013 | Ryshtun et al. | 324/683 |
| 8,664,936 B2 | * | 3/2014 | Oehler et al. | 324/120 |
| 2010/0097257 A1 | * | 4/2010 | Edelson et al. | 341/143 |

* cited by examiner

*Primary Examiner* — Thomas J Hiltunen
(74) *Attorney, Agent, or Firm* — TIPS Group

(57) ABSTRACT

A digital input circuit includes a series connection of a current limiter and a switch having a switch control input coupled between a signal input and ground, and a logic level shifter coupled to the signal input and having a switch control output coupled to the switch control input and a signal output, where a maximum amplitude at the signal input is greater than a maximum amplitude at the signal output. A digital input method includes coupling an input signal to ground with a current limiter by closing an electronic switch, providing an output signal responsive to the input signal, where a maximum amplitude of the input signal is greater than a maximum amplitude of the output signal, by latching the output signal while the input signal is above a threshold voltage and opening the electronic switch after the output signal is latched.

10 Claims, 5 Drawing Sheets

DIGITAL INPUT CIRCUIT AND METHOD FOR HIGH VOLTAGE SENSORS

BACKGROUND

Digital input modules, used in industrial and building automation, can contain anywhere from as few as four to as many as thousands of digital inputs or "channels" for interfacing with various sensors and switches. These modules are typically used in conjunction with a specialized microcomputer referred to as a Programmable Logic Controller or PLC. With a typical digital input module of the prior art, each input, when in the "on" state, can draw, for example, 100 to 300 mW of power from the module's power supply. This high power usage limits the density (and therefore the maximum number) of channels that can be provided by digital input modules of the prior art due to design requirements including heat dissipation and maximum power consumption.

A digital input module is primarily responsible for the detection of binary (on/off) signals from digital sensors such as proximity sensors, level sensors, limit switches, push buttons, etc., that operate off of a high voltage or "field power" supply. A field power supply is nominally about 24 volts DC (VDC) with a 30 VDC maximum rating. The digital input module converts the high voltage sensor signals to lower voltage signals (e.g. 5 VDC) that can be processed by the PLC. A digital input module also typically filters or de-bounces the sensor signals and may provide galvanic isolation of the high voltage sensors from the low voltage PLC for the safety of human operators as well as reliable operation of the low voltage controller circuits.

It is important to note that, in most cases, the detection of a valid logic "1" or logic "0" from industrial digital sensors requires measuring both the voltage from the sensor and the current flowing through it. For a valid logic "1", it is required that both voltage and current be above certain preset thresholds. These thresholds are typically governed by IEC 61131-2 specifications as set forth by the International Electrotechnical Commission having a central office in Geneva, Switzerland, incorporated herein by reference.

There are several methods used to detect the high voltage (e.g. 24 VDC) binary output of industrial sensors and switches. One method is to use a discrete resistor divider circuit as illustrated in FIG. 1A. With this circuit, a resistor divider is used to detect a predefined voltage threshold and turn on an optocoupler once a voltage threshold and a current threshold are exceeded. The optocoupler serves as a galvanic isolator as well as a voltage level translator to supply a 5V binary signal, representing the state of the sensor, to a PLC.

In FIG. 1A, a typical resistor divider circuit 10 includes an input resistor 12, an input capacitor 14, a first divider resistor 16, a filter capacitor 18, a second divider resistor 20, a first current limiting resistor 22, an indicator LED 24, a second current limiting resistor 25, an optocoupler (or "opto-isolator" or "optical isolator") 26, and a pull-up resistor 28. A sensor 30, represented here as a switch, connects the input resistor 12 to the field power supply (e.g. 24 VDC). The voltage applied to the optocoupler 26 is divided by the first divider resistor and, primarily, by the second divider resistor 20, although system designers would also have to account for other resistances that are in parallel with the second divider resistor 20. The capacitors 14 and 18 form a part of an RC filter which helps debounce the input signal developed by the activation of the sensor 30, and the optocoupler 26 provides galvanic isolation between the high-voltage side of the resistor divider circuit 10 (e.g. 24 VDC peak amplitude) and the low-voltage side of the resistor divider circuit 10 (e.g. 10 VDC peak amplitude).

The resister divider circuit 10 has the advantage of economy as it is fairly inexpensive to implement. A problem with resistor divider circuit 10 is that it has high power consumption due to current continuously flowing through the divider resistors 16 and 20 when the sensor 30 is activated. In fact, with the resistor divider circuit 10, power consumption as set forth by the equation P=V*I increases quadratically with the sensor voltage, since the current increases linearly according to Ohm's law: I=V/R. Power consumption of the resistor divider circuit with the sensor 30 activated (e.g. the switch is closed) is therefore $P=V_s^2/R$, where $V_s$ is the field voltage.

As illustrated in FIG. 1B, another method utilizes a current limiter circuit 32 including an input resistor 34, an input capacitor 36, a current limiter 38, a voltage/current comparator 40, a low pass filter 42 and a clock (or "oscillator") 44. A sensor 46, again represented here by a switch, couples the input resistor 34 to a 24 VDC field power supply.

In operation, the current limiter circuit 32 allows the current to rise linearly with voltage provided by sensor 46 up to a detection threshold and is then clamped from rising any further by the current limiter 38. No further increases in input current are possible as the sensor voltage rises to its maximum level set by the field power supply. Detector 40 is used to detect the binary state of the sensor and convert it down to 5V. Digital low pass filter 42, which is clocked by clock 44, is then used after the detector 40 to filter and de-bounce the sensor signal.

The current limiter circuit 32 consumes less power than the resistor divider circuit 10 because the current limiter 38 limits the maximum current that can be drawn from the high voltage sensor 46. However, the current limiter continues to draw current at the current limit ("clamp") level $i_L$ as long the sensor 46 output is at a high voltage level. Therefore, while the power consumption of the current limiter circuit of FIG. 1B is less than the power consumption of the resistor divider circuit of FIG. 1A, the current limiter circuit still consumes a considerable amount of power which can limit channel density and which necessitates larger power supplies.

These and other limitations of the prior art will become apparent to those of skill in the art upon a reading of the following descriptions and a study of the several figures of the drawing.

SUMMARY

In an embodiment, set forth by way of example and not limitation, a digital input circuit includes a series connection of a current limiter and a switch having a switch control input coupled between a signal input and ground, and a logic level shifter coupled to the signal input and having a switch control output coupled to the switch control input and a signal output, where a maximum amplitude at the signal input is greater than a maximum amplitude at the signal output. In another example embodiment, the series connection of a current limiter and a switch and the logic level shifter comprises at least one of a packaged integrated circuit and discrete components. In another example embodiment, the series connection of the current limiter and switch and the logic level shifter comprises one of a plurality of channels.

In an embodiment, set forth by way of example and not limitation, a digital input method includes coupling an input signal to ground with a current limiter by closing an electronic switch, providing an output signal responsive to the input signal, where a maximum amplitude of the input signal is greater than a maximum amplitude of the output signal, by latching the output signal while the input signal is above a threshold voltage and opening the electronic switch after the output signal is latched. In another example embodiment, the digital input method further includes providing debouncing between the input signal and the output signal.

An advantage of various example embodiments is that the power consumption of a PCL digital input module used in industrial automation can be reduced be substantially reduced, e.g. 50% or more.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENTS

Figure 1A:
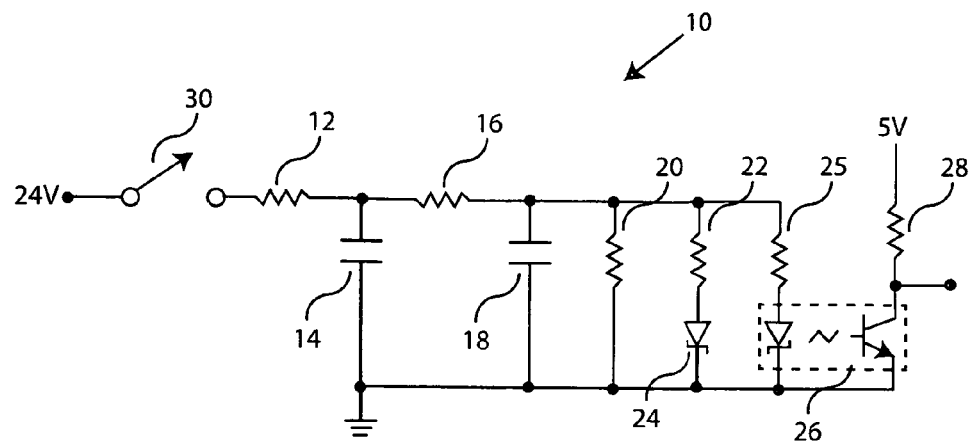
FIG. 1A is a schematic diagram of a first prior art digital input module.
Figure 1B:
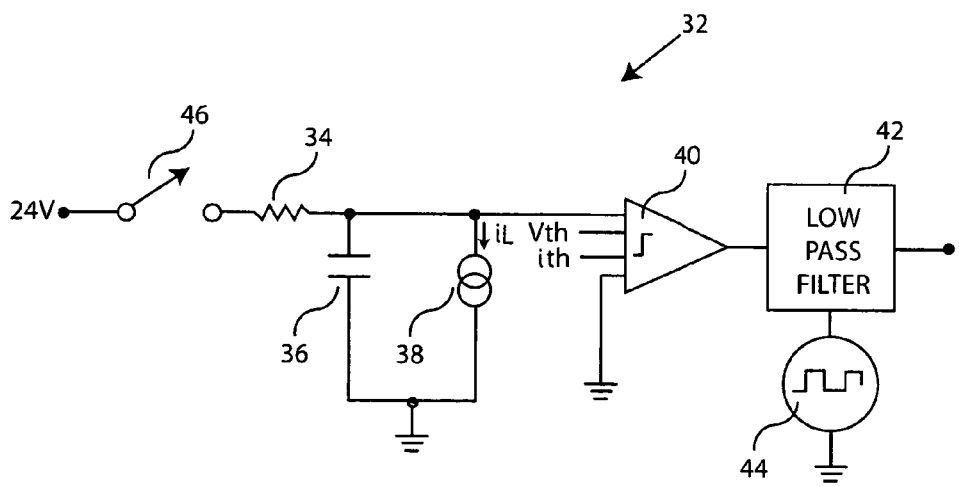
FIG. 1B is a schematic diagram of a second prior art digital input module.
Figure 2:
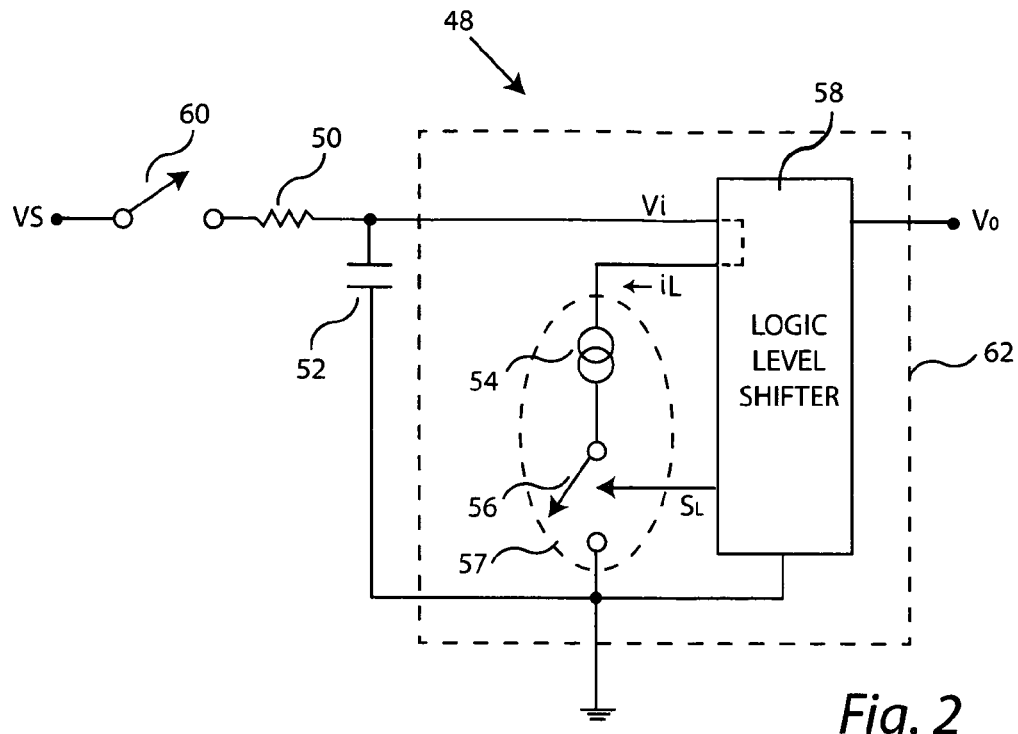
FIG. 2 is a block diagram of an example improved digital input module.

FIGS. 1A and 1B were described with reference to the prior art. FIG. 2 is a block diagram of an example improved digital input module 48 including an input resistor 50, and input capacitor 52, a current limiter 54, an electronic switch 56 and a logic level shifter 58. The current limiter 50 and the electronic switch 56 comprise a series connection 57 coupled, directly or indirectly, between the input voltage $V_i$ and ground. A sensor 60, illustrated here as a switch, couples the input resistor 50 to the field voltage supply $V_s$ (e.g. 24 VDC).

As indicated by broken line 62, the current limiter 54, electronic switch 56 and logic level shifter 58 may form a part of a packaged integrated circuit, in an example embodiment. In another example embodiment, the components within broken line 62 may comprise discrete components. In a still further example embodiment, the components within broken line 62 may comprise a combination of discrete components and one or more packaged integrated circuits.

In an embodiment, set forth by way of example but not limitation, the circuit 60 can comprise one channel of a plurality of channels. In this example embodiment, other components of the digital input module 48, such as input resistor 50 and input capacitor 62, may be provided externally, e.g. on a printed circuit (PC) board of the digital input module 48.

Figure 3:
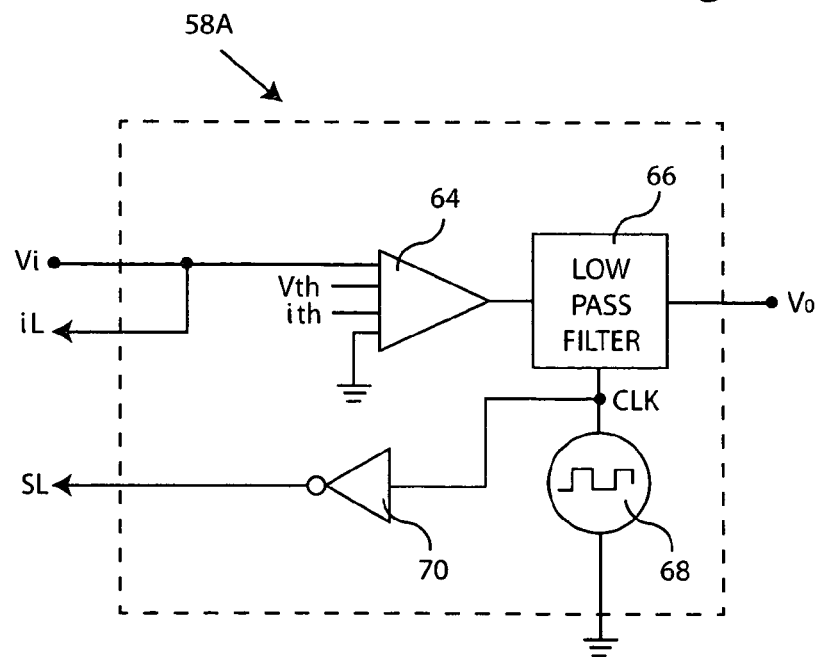
FIG. 3 is a block diagram of a first example logic level shifter of FIG. 2.

FIG. 3 is a block diagram of a first non-limiting example logic level shifter 58A of FIG. 2. In this example, logic level shifter 58A includes a voltage/current comparator 64, a low pass filter 66, a clock 68 producing a clock signal CLK, and an inverter 70. An input of the comparator 64 is coupled to the input resistor 50 and to the current limiter 54 of FIG. 2. That is, in this example embodiment, the current limiter 54 is connected directly to the input voltage $V_i$. Other inputs of the comparator 64 are connected to a threshold detection reference voltage $V_{TH}$ and to a threshold detection reference current $i_{TH}$. The low pass filter 66 provides a debounce function in that it removes certain transients that might be present in the input signal ($V_i$). In this example embodiment, the low pass filter 66 is a digital low pass filter, which is clocked by a signal CLK developed by the clock 68. The clock 68 can be an RC oscillator having a nominal frequency of about 125 KHz, although other frequencies are also suitable depending upon the low pass filter implementation and system requirements, as will be appreciated by those of skill in the art. A switch control signal $S_L$ is developed at the output of the inverter 70 and controls the electronic switch 56 (see also FIG. 2). Also, as will be appreciated by those of skill in the art, galvanic isolation can be provided by an external optocoupler, external digital isolator, or an integrated digital isolator, by way of non-limiting examples.

Figure 4:
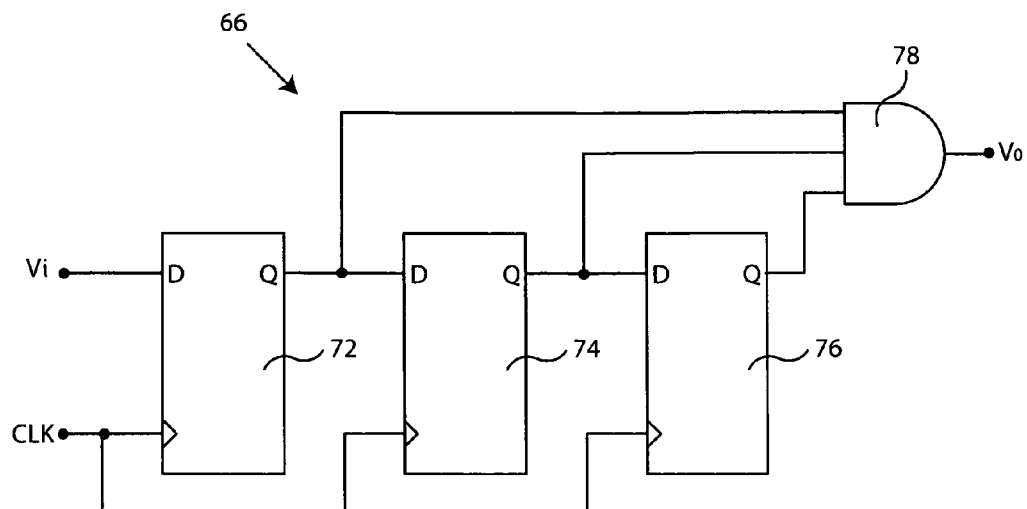
FIG. 4 is a schematic diagram of an example low pass filter of FIG. 4.

FIG. 4 is a schematic diagram, set forth by way of example and not limitation, of a low pass filter 66 of FIG. 3. In this example, three bistable multivibrators 72, 74 and 76, and an AND gate 78 are used to debounce the high voltage input signal $V_i$. In this non-limiting example, the multivibrators 72, 74, 76 are positive edge clock triggered D flip-flops having their clock inputs coupled to the CLK signal. The input signal $V_i$ is coupled to the D input of multivibrator 72, the Q output of the multivibrator 72 is coupled to the D input of multivibrator 74 and the Q output of multivibrator 74 is coupled to the D input of multivibrator 76. The AND gate 78 has inputs coupled to the Q outputs of the three multivibrators 72, 74, 76 and has an output of $V_o$.

Figure 5:
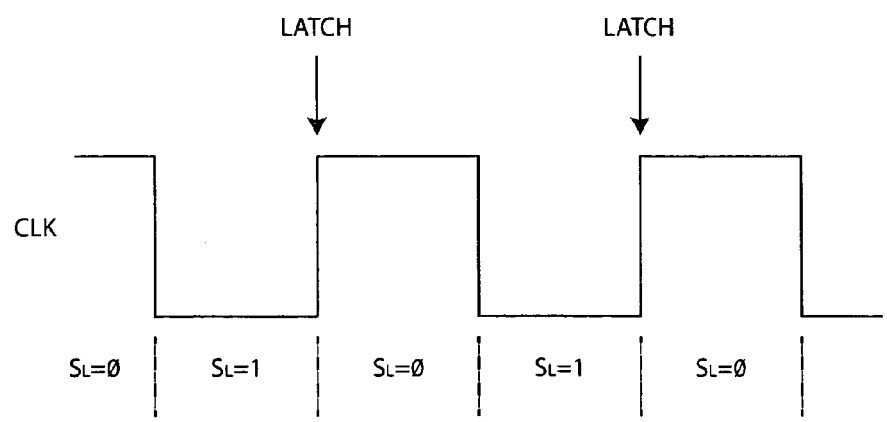
FIG. 5 is a timing diagram illustrating an example operation of the example digital input module of FIGS. 2-4.

FIG. 5 is a timing diagram illustrating an example operation of the of the example digital input module of FIGS. 2-4. In this non-limiting example, when the clock CLK is high ("HI" or "1"), the switch control signal $S_L$ is low ("LO" or "0"), opening switch 56, and when the clock CLK is low the switch control signal $S_L$ is high, closing the switch 56. Therefore, for every ½ cycle of the signal CLK, the switch 70 is open, and the current $i_L$ through the current limiter is zero. Therefore, in this example, the power use due to the current $i_L$ is decreased by about 50%.

It will therefore be appreciated that the example embodiment of FIGS. 2-5, the same clock (or "oscillator") 68 used to clock the digital low pass ("debounce") filter 66 is used to control a switch 56 in series with current limiter 54 to turn the current flow off during the part of the cycle when the output of the detector 64 is not being sampled by the filter. By turning the input current $i_L$ off, when the signal is not being processed, power consumption decreases, and a power savings of about 50% or more can be achieved.

The power savings are directly correlated to the on/off duty cycle of the current limiter 54. In one example embodiment, a first half of a clock cycle of clock CLK is used to turn the current limiter 54 ON and power the sensor 60 output circuitry. The duration of this half cycle must be long enough to provide enough settling time to charge any capacitances (parasitic or intentional) associated with the sensor 60 output and connection wiring.

As will be appreciated by those of skill in the art, the electronic switch 56 can be implemented a variety of fashions. By way of non-limiting example, an N-channel MOSFET can be placed in series with the current limiter 54, thereby forming a series connection 57, with its gate coupled to the signal S1.

Figure 6:
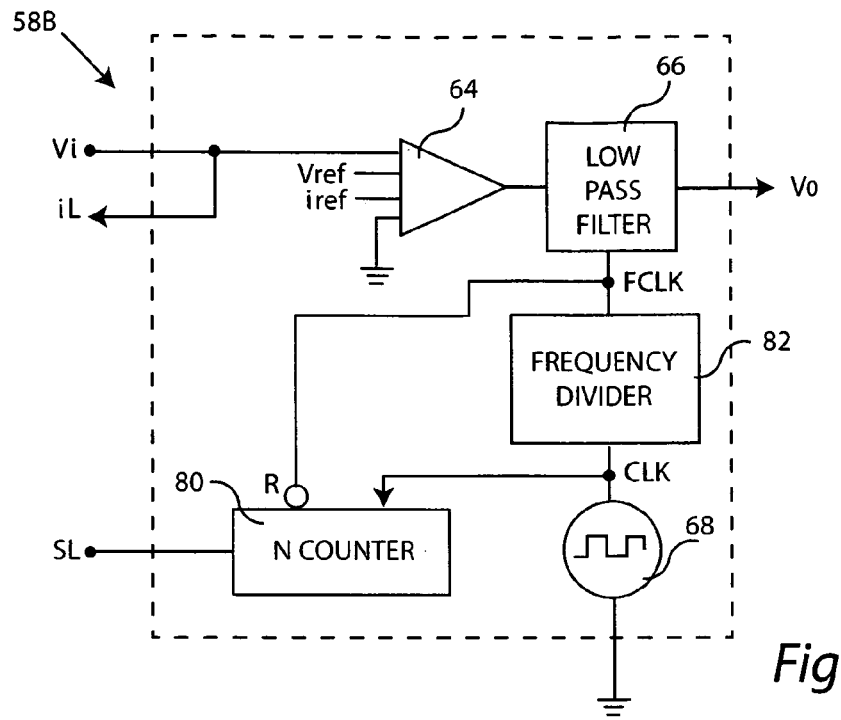
FIG. 6 is a schematic diagram of a second example logic level shifter of FIG. 2.

FIG. 6 is a block diagram of a second non-limiting example logic level shifter 58B of FIG. 2, where like components will have like reference numbers with respect to the first non-limiting example logic level shifter 58A of FIG. 3. In this example, logic level shifter 58B includes a voltage/current comparator 64, a low pass filter 66 and a clock 68 producing a clock signal CLK. Logic level shifter 58B also includes a frequency divider 82 having a filter clock FCLK and an N-counter 80.

In this non-limiting example, an input of the comparator 64 is coupled to the input resistor 50 and to the current limiter 54 of FIG. 2. That is, in this example embodiment, the current limiter 54 is connected directly to the input voltage $V_i$. Other inputs of the comparator 64 are connected to a threshold detection reference voltage $V_{TH}$ and to the threshold detection reference current $i_{TH}$. The low pass filter 66 provides debounce between the high-voltage ($V_i$) and low voltage ($V_o$) sides of the logic level shifter 58B. In this example embodiment, the low pass filter 66 is a digital low pass filter, which is clocked by the signal FCLK developed by the frequency divider 82. A switch control signal $S_L$ is developed at the output of the N-counter 80 and controls the electronic switch 56 (see also FIG. 2).

Figure 7:
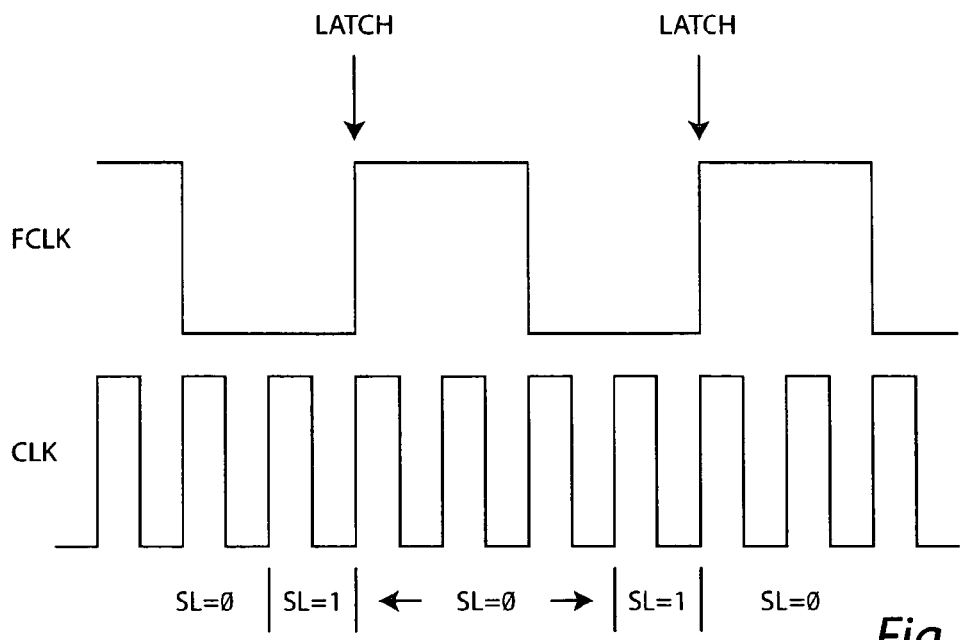
FIG. 7 is a timing diagram illustrating an example operation of the example digital input module of FIGS. 2, 4 and 6.

With additional reference to the timing diagram of FIG. 7, the N-counter is designed to count "N" cycles of the clock CLK and to provide an output to inverter 70 when it reaches N cycles. In this example, when the clock signal FCLK is HI, the N-counter is reset and the signal SL is LO ("0"). When the clock signal FLCK is LO, the N-Counter starts counting cycles of the clock CLK. For example, in this case the N-counter 80 counts to N=1, and after counting one cycle of the clock CLK after FLCK goes low, the signal SL goes HI ("1"). In this way, the current $i_L$ flows through the current limiter 56 only 25% of the time, further decreasing power consumption, in this non-limiting examples. It will be appreciated that by increasing the relative frequency between CLK and FCLK, and by counting to higher numbers than N=1 in the N-counter 80, that even further power savings can be achieved.

Figure 8:
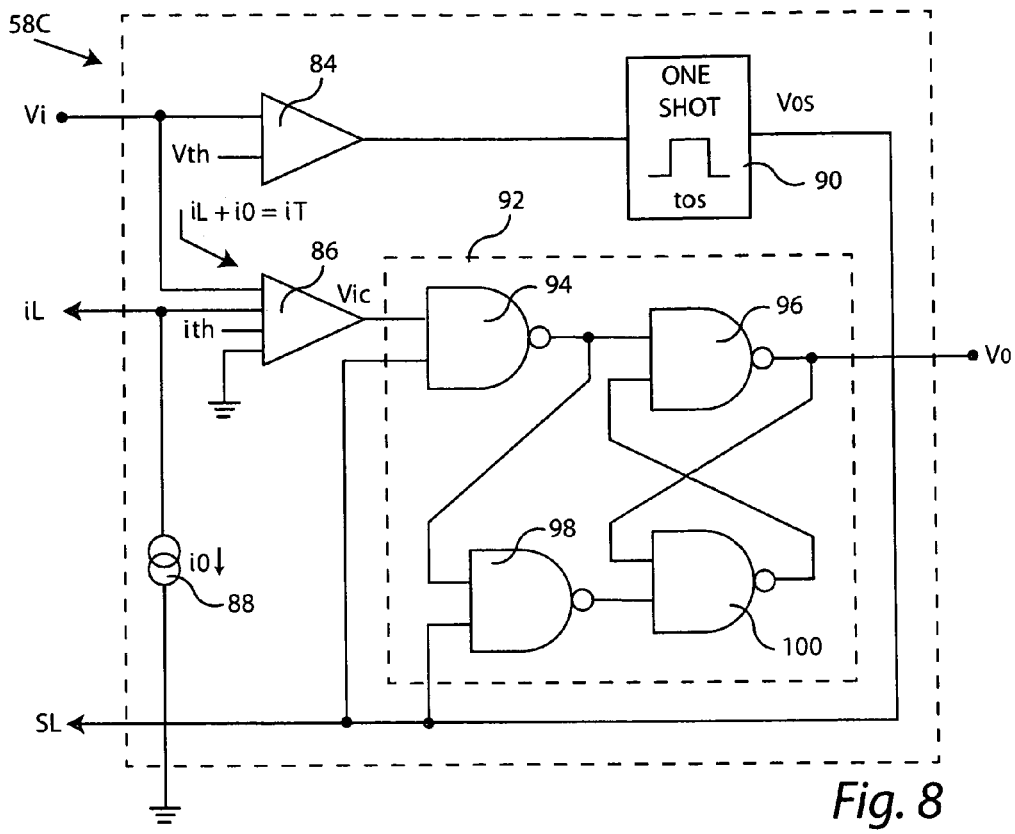
FIG. 8 is a schematic diagram of a third example logic level shifter of FIG. 2.

FIG. 8 is a schematic diagram of a third non-limiting example logic level shifter 58C of FIG. 2. In this example, logic level shifter 58C includes a voltage comparator 84, a current comparator 86, a low current limiter 88, a monostable multivibrator 80 and a latch 92. In this example embodiment, the monostable multivibrator 80 is a "one-shot" having a period "$t_{os}$" and the latch 92 is formed by four NAND gates 94, 96, 98 and 100 connected in a "T latch" configuration. Inputs of voltage comparator 84 and current comparator 86 are coupled to the input resistor 50 of FIG. 2, in this example. Current $I_T = I_L + I_{lo}$ flows through the current comparator 86. Therefore, in this example, the current limiter 54 is coupled to the input voltage $V_i$ by current comparator 86 rather than being connected directly to $V_i$. A reference voltage $V_{TH}$ is applied to an input of voltage comparator 84 and a reference current $i_{TH}$ flows through current comparator 86.

It should be noted that, unlike the previous example embodiments, the example logic level shifter 58C of FIG. 8 does not require a clock (oscillator) or a low pass filter to perform debounce. Instead, one-shot 90 develops the signal $S_L$ to turn on and off the electronic switch 56 of FIG. 2. The current limiter 88 is provided to maintain a bias current on the current detector 86.

Figure 9:
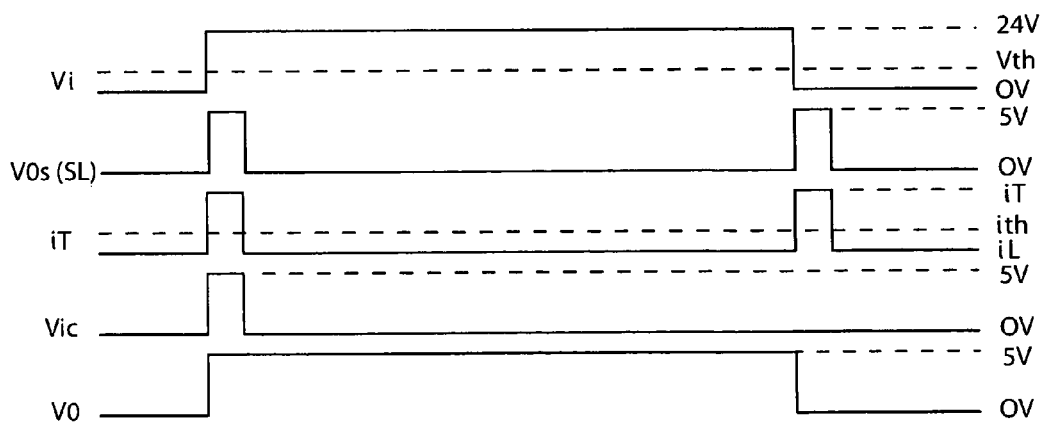
FIG. 9 is a timing diagram illustrating an example operation of the example digital input module of FIGS. 2, 4 and 8.

With additional reference to the timing diagram of FIG. 9, in this non-limiting example the current limiter 88 is always on but is set to a low current value $I_{lo}$ which is considerably below the required current trip point threshold, $I_{th}$. Voltage sensor 84 is constantly monitoring the input voltage $V_i$. Any time the input voltage $V_i$ exceeds the reference threshold voltage $V_{th}$, one-shot 90 is activated. The one shot closes the switch 56 permitting the current to rise to $i_T$ to cause current comparator 86 to develop a HI or "1" output $V_{1C}$, to toggle latch 92.

During the time that the one-shot 90 is activated (e.g. $t_{os}$), if the value of the current detected by the current comparator 86 exceeds the threshold current $I_{th}$, then the latch is toggled to a logical HI, indicating that a valid logic "1" has been detected from the sensor 60. If the current does not exceed $I_{th}$, the latch is toggled to logical LO, indicating that current from the sensor was below the required threshold $I_{th}$, and the sensor 60 signal is a logic "0". In this manner current is drawn and power is dissipated only during time $t_{os}$, instead of during the entire time that the sensor is in the "on" state, $T_{on}$. This reduces the average power dissipated by a factor of $t_{os}/T_{on}$. It will be appreciated by those of skill in the art that $t_{os}$ is preferably designed to be long enough to allow sufficient settling time to charge/discharge any parasitic and/or intentional capacitances associated with the sensor, its wiring and the input detection circuitry.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A digital input circuit comprising:
   a series connection of a current limiter and a switch having a switch control input coupled between a signal input and ground;
   a logic level shifter including a voltage comparator and a digital low pass filter, the logic level shifter being coupled to the signal input and having a switch control output coupled to the switch control input and a signal output, where a maximum amplitude at the signal input is greater than a maximum amplitude at the signal output; and
   a clock coupled to the low pass filter and to the switch control input.

2. A digital input circuit as recited in claim 1 wherein the digital low pass filter comprises a plurality of bistable multivibrators.

3. A digital input circuit as recited in claim 2 wherein the bistable multivibrators comprise positive edge clock triggered flip-flops.

4. A digital input circuit as recited in claim 1 wherein the logic level shifter includes a current comparator having a current input coupled to the signal input and a current output coupled to ground by the series connection of a current limiter and a switch.

5. A digital input circuit as recited in claim 1 wherein the series connection of a current limiter and a switch and the logic level shifter comprise a packaged integrated circuit.

6. A digital input circuit as recited in claim 1 wherein the series connection of a current limiter and a switch and the logic level shifter comprise one of a plurality of channels.

7. A digital input circuit as recited in claim 1 further comprising an input resistor coupling a sensor input to the signal input and a filter capacitor coupling the signal input to ground.

8. A digital input circuit comprising:
   a series connection of a current limiter and a switch having a switch control input coupled between a signal input and ground;
   a logic level shifter including a voltage comparator and a digital low pass filter having a plurality of positive edge clock triggered flip-flop bistable multivibrators, the logic level shifter being coupled to the signal input and having a switch control output coupled to the switch control input and a signal output, where a maximum amplitude at the signal input is greater than a maximum amplitude at the signal output, wherein the voltage comparator has an input coupled to the signal input and an output coupled to the signal output by the digital low pass filter, and an AND gate having inputs coupled to outputs of the flip-flops and having an output providing the signal output.

9. A digital input circuit comprising:
   a series connection of a current limiter and a switch having a switch control input coupled between a signal input and ground;
   a logic level shifter including a voltage comparator and a digital low pass filter, the logic level shifter being coupled to the signal input and having a switch control output coupled to the switch control input and a signal output, where a maximum amplitude at the signal input is greater than a maximum amplitude at the signal output, wherein the voltage comparator has an input coupled to the signal input and an output coupled to the signal output by the digital low pass filter; and
   a clock coupled to the low pass filter and to the switch control input.

10. A digital input circuit as recited in claim 9 further comprising logic coupling the clock to the switch control input.

\* \* \* \* \*